(12) United States Patent
Kimura (10) Patent No.: US 12,043,130 B2
(45) Date of Patent: Jul. 23, 2024

(54) COOLING STRUCTURE, CHARGING APPARATUS, AND VEHICLE

(71) Applicant: Panasonic Intellectual Property Management Co., Ltd., Osaka (JP)

(72) Inventor: Shinya Kimura, Tokyo (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 713 days.

(21) Appl. No.: 17/196,473

(22) Filed: Mar. 9, 2021

(65) Prior Publication Data

US 2021/0291678 A1 Sep. 23, 2021

(30) Foreign Application Priority Data

Mar. 18, 2020 (JP) ................................. 2020-047729

(51) Int. Cl.
| | |
|---|---|
| *H02J 7/00* | (2006.01) |
| *B60L 53/18* | (2019.01) |
| *B60L 53/302* | (2019.01) |
| *H02J 7/14* | (2006.01) |

(52) U.S. Cl.
CPC ............ *B60L 53/302* (2019.02); *B60L 53/18* (2019.02); *B60L 2210/30* (2013.01)

(58) Field of Classification Search
CPC ..... B60L 53/302; B60L 53/18; B60L 2210/30
USPC ......................................................... 320/134
See application file for complete search history.

(56) References Cited

U.S. PATENT DOCUMENTS

| | | | | |
|---|---|---|---|---|
| 6,232,743 | B1 * | 5/2001 | Nakanishi ......... | H02J 7/007194 320/103 |
| 10,756,498 | B1 * | 8/2020 | Sarraf .................... | B60L 53/302 |
| 10,780,849 | B1 * | 9/2020 | Garcia ................ | B60R 16/0231 |
| 2012/0018238 | A1 * | 1/2012 | Mizoguchi .............. | B60L 50/66 180/68.5 |
| 2018/0027646 | A1 | 1/2018 | Sumida | |
| 2019/0168593 | A1 * | 6/2019 | Nakaso ................... | B60L 58/24 |
| 2019/0199075 | A1 * | 6/2019 | Sugimura .............. | H01B 9/006 |
| 2019/0341661 | A1 * | 11/2019 | Guerra .................... | B60L 53/16 |
| 2020/0266578 | A1 * | 8/2020 | Durse ................... | B60L 53/302 |
| 2020/0313328 | A1 * | 10/2020 | Mathews ............... | H01R 13/35 |
| 2020/0353791 | A1 * | 11/2020 | Sakabe .................. | B60L 58/27 |
| 2022/0134896 | A1 * | 5/2022 | Chase .................... | B60L 53/16 439/34 |

FOREIGN PATENT DOCUMENTS

| | | |
|---|---|---|
| JP | 2015139288 A | 7/2015 |
| JP | 2016-134284 A | 7/2016 |
| JP | 2016134956 A | 7/2016 |
| JP | 2017152441 A | 8/2017 |

OTHER PUBLICATIONS

English Translation of Japanese Notice of Reasons for Rejection, dated Aug. 1, 2023, for Japanese Patent Application No. 2020-047729. (3 pages).

* cited by examiner

*Primary Examiner* — Alexis B Pacheco (74) *Attorney, Agent, or Firm* — Seed IP Law Group LLP (57) ABSTRACT

A cooling structure is provided. The cooling structure includes a harness, a board electrically connected to the harness, a heat transfer member whose one end is connected between the harness and the board, the heat transfer member being a member to which heat of the harness is transmitted, and a heat sink connected to the other end of the heat transfer member and configured to radiate heat transmitted to the heat transfer member.

17 Claims, 6 Drawing Sheets

COOLING STRUCTURE, CHARGING APPARATUS, AND VEHICLE

TECHNICAL FIELD

The present disclosure relates to a cooling structure, a charging apparatus, and a vehicle.

BACKGROUND ART

PTL 1 discloses a technique of radiating heat generated at a connector due to a large current flowing between boards. The connector includes a contact in contact with a plug and a plate-shaped conductive member where the contact is fixed, and the conductive member radiates heat transmitted to the conductive member from the contact point of the plug and the contact.

CITATION LIST

Patent Literature

PTL 1
Japanese Patent Application Laid-Open No. 2016-134284

SUMMARY OF INVENTION

Solution to Problem

A cooling structure according to an embodiment of the present disclosure includes a harness, a board electrically connected to the harness, a heat transfer member whose one end is connected between the harness and the board, the heat transfer member being a member to which heat of the harness is transmitted, and a heat sink connected to the other end of heat transfer member and configured to radiate heat transmitted to the heat transfer member.

A charging apparatus according to an embodiment of the present disclosure includes a cooling structure.

A vehicle according to an embodiment of the present disclosure includes a charging apparatus.

Advantageous Effects of Invention

According to an embodiment of the present disclosure, it is possible to construct a cooling structure, a charging apparatus, and a vehicle that can suppress the temperature rise of the board connected to the harness.

Further advantages and effects of an embodiment of the present disclosure will be apparent from the specification and drawings.

Such advantages and/or effects are provided by several embodiments and features described in the specification and drawings, respectively, but not necessarily all of them need to be provided in order to obtain one or more identical features.

DESCRIPTION OF EMBODIMENTS

A preferred embodiment of the present disclosure is elaborated below with reference to the accompanying drawings. Note that in the specification and drawings, components having substantially the same functions are denoted with the same reference numerals and overlapping description thereof is omitted.

Embodiment

Figure 1:
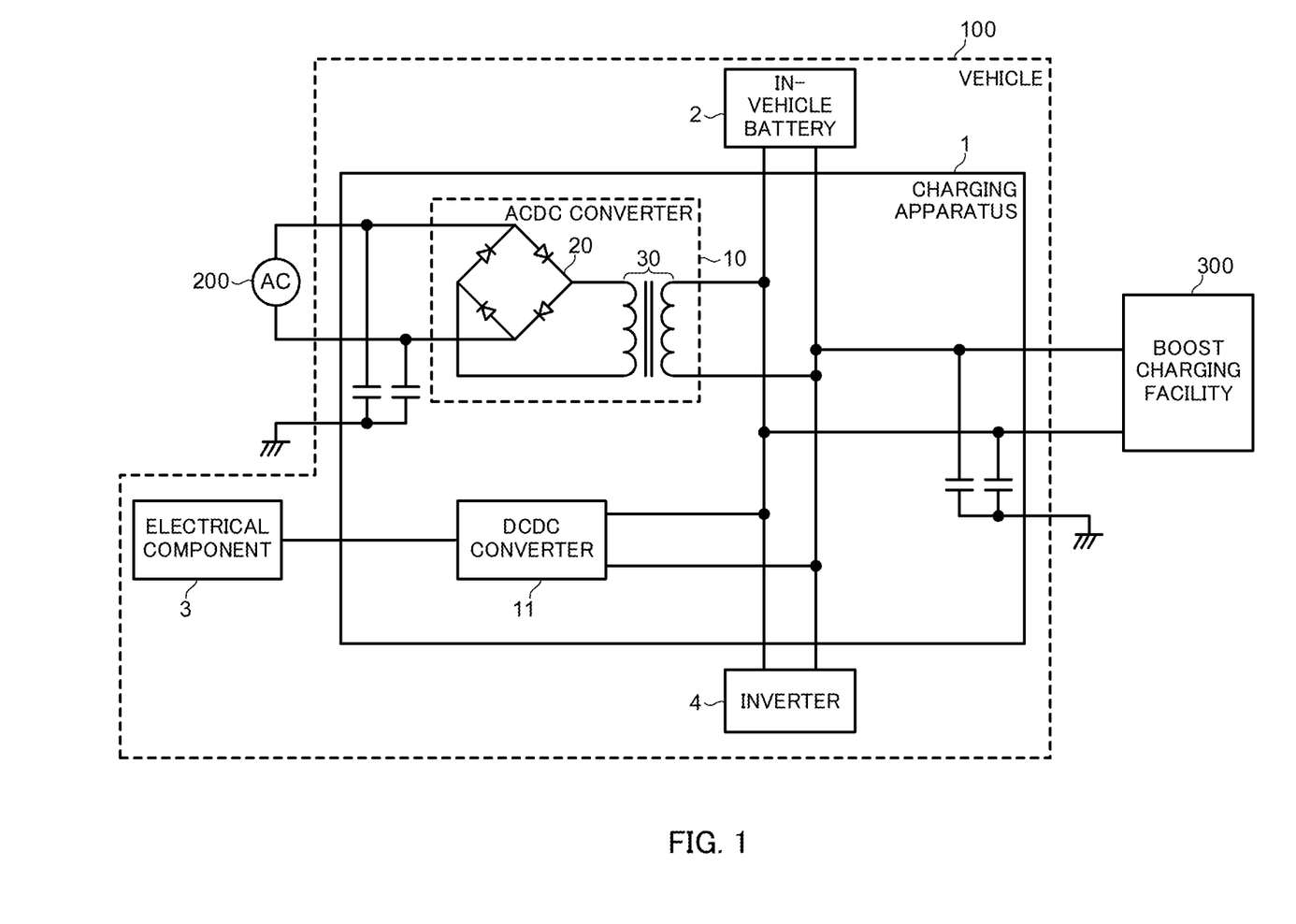
FIG. 1 illustrates a configuration of a vehicle according to an embodiment of the present disclosure.

FIG. 1 illustrates a configuration of a vehicle according to an embodiment of the present disclosure. Vehicle 100 includes charging apparatus 1, in-vehicle battery 2, electrical component 3, and inverter 4. Vehicle 100 is, for example, an electric vehicle such as an electric automobile, a hybrid automobile, and a plug-in hybrid automobile.

Charging apparatus 1 is an apparatus that charges in-vehicle battery 2 with power supplied from AC power source 200 or boost charging facility 300. Charging apparatus 1 includes alternating current to direct current (ACDC) converter 10, and direct current to direct current (DCDC) converter 11.

ACDC converter 10 includes bridge circuit 20 for full-wave rectification of AC voltage, and isolated transformer 30. Note that ACDC converter 10 also includes a switching device (not illustrated in the drawing) for converting full-wave rectified voltage into a DC voltage of a desired value, a board and the like. The board is a printed board for mounting circuit components such as bridge circuit 20 and the switching device. The board is elaborated later. ACDC converter 10 having the above-mentioned configuration charges in-vehicle battery 2 by converting an AC voltage supplied from AC power source 200 into a DC voltage of a desired value and supplying it to in-vehicle battery 2.

In-vehicle battery 2 is a unit for storing power for driving a travelling motor (main electric motor), electrical component 3 and the like mounted on vehicle 100, and is, for example, a lithium ion battery, a nickel hydrogen battery or the like. Examples of electrical component 3 include a navigator, an audio apparatus, an air-conditioner, a power window, a defogger, an electronic control unit (ECU), a global positioning system (GPS) module, and an in-vehicle camera. Inverter 4 is a power conversion apparatus that converts direct current power into alternating current power and supplies it to the main electric motor.

In vehicle 100 having the above-mentioned configuration, there is a growing need to shorten the charging time of in-vehicle battery 2 as the storage capacity of in-vehicle battery 2 increases. When the output current of ACDC converter 10 is increased in order to charge in-vehicle battery 2 in a short time, the heat generated in the wiring connected to ACDC converter 10, i.e., a power supply harness, abruptly increases. This heat increases in proportion to the square of the current flowing in the conductor. The heat generated in the harness is transmitted to the board in ACDC converter 10 connected to the harness. As such, as the current flowing through the harness increases, the temperature of the board tends to increase.

However, except for boards with special specifications having a high rated temperature designed for mounting power modules such as IGBTs, the rated temperature of a typical board tends to be lower than the rated temperature of the harness connected to the board. The rated temperature of a typical board is, for example, 120° C., and the rated temperature of the harness is, for example, 200° C. The reason for this is that, for example, since the value of the current for driving electrical component 3 is smaller than the charging current, the temperature of a board of a typical specification used for DCDC converter 11 and the like is not assumed to exceed the rated temperature. As such, when a current of several tens [A] to hundreds [A] flows through the harness, the heat generated at the harness is transmitted to the board connected to the harness. As a result, even when the temperature of the harness is equal to or smaller than the rated temperature of the harness, the temperature of the board exceeds the rated temperature of the board and the board may be damaged. As a countermeasure against such a heat, it is necessary to take a measure such as using a board with a special specification that has a high rated temperature, but this is not preferable because ACDC converter 10 has to be provided as a specially designed product, which increases the manufacturing cost.

In light of the foregoing, charging apparatus 1 according to the present embodiment employs a cooling structure of suppressing the temperature rise of the board by making it difficult for the heat generated at the harness to be transmitted to the board with a path for letting a part of the heat generated at the harness escaping to the heat dissipation member. The cooling structure is described below with reference to FIG. 2, etc.

Figure 2:
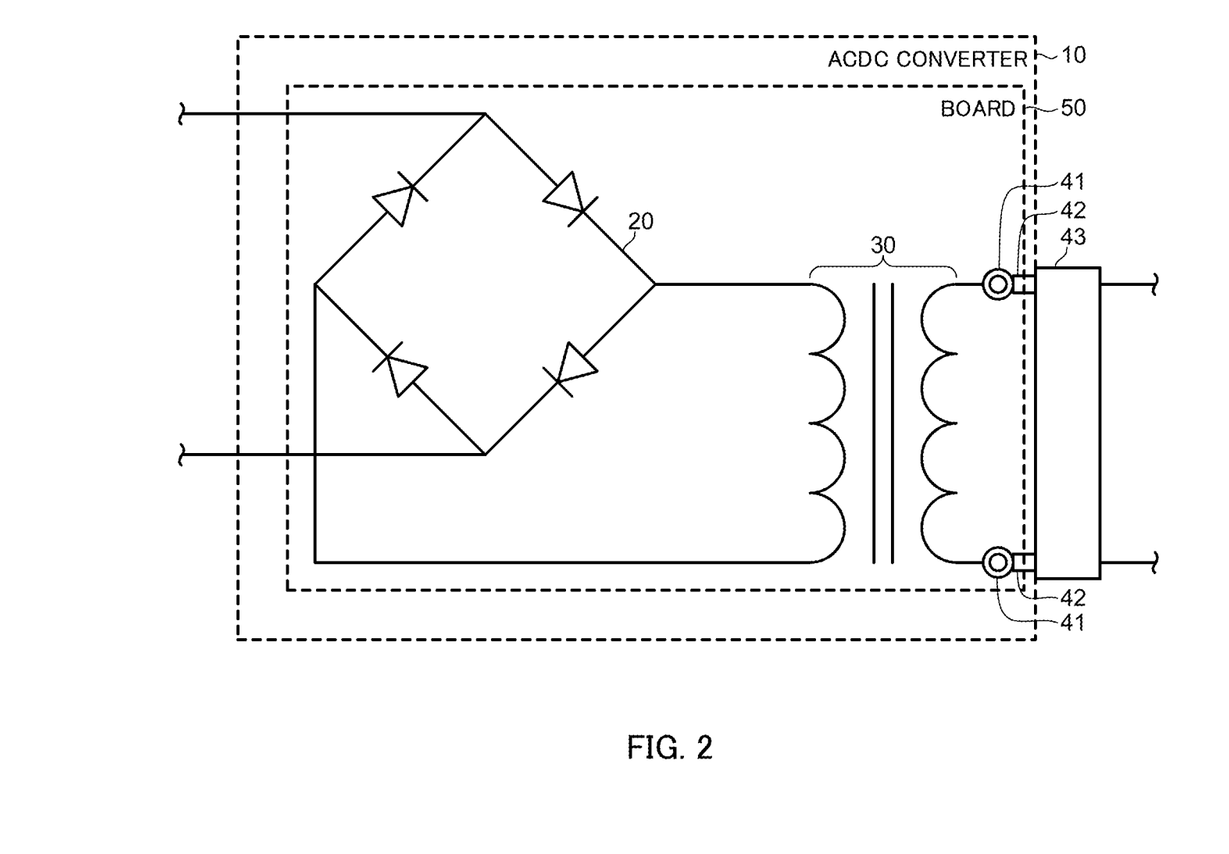
FIG. 2 is an enlarged view of an ACDC converter.
Figure 3:
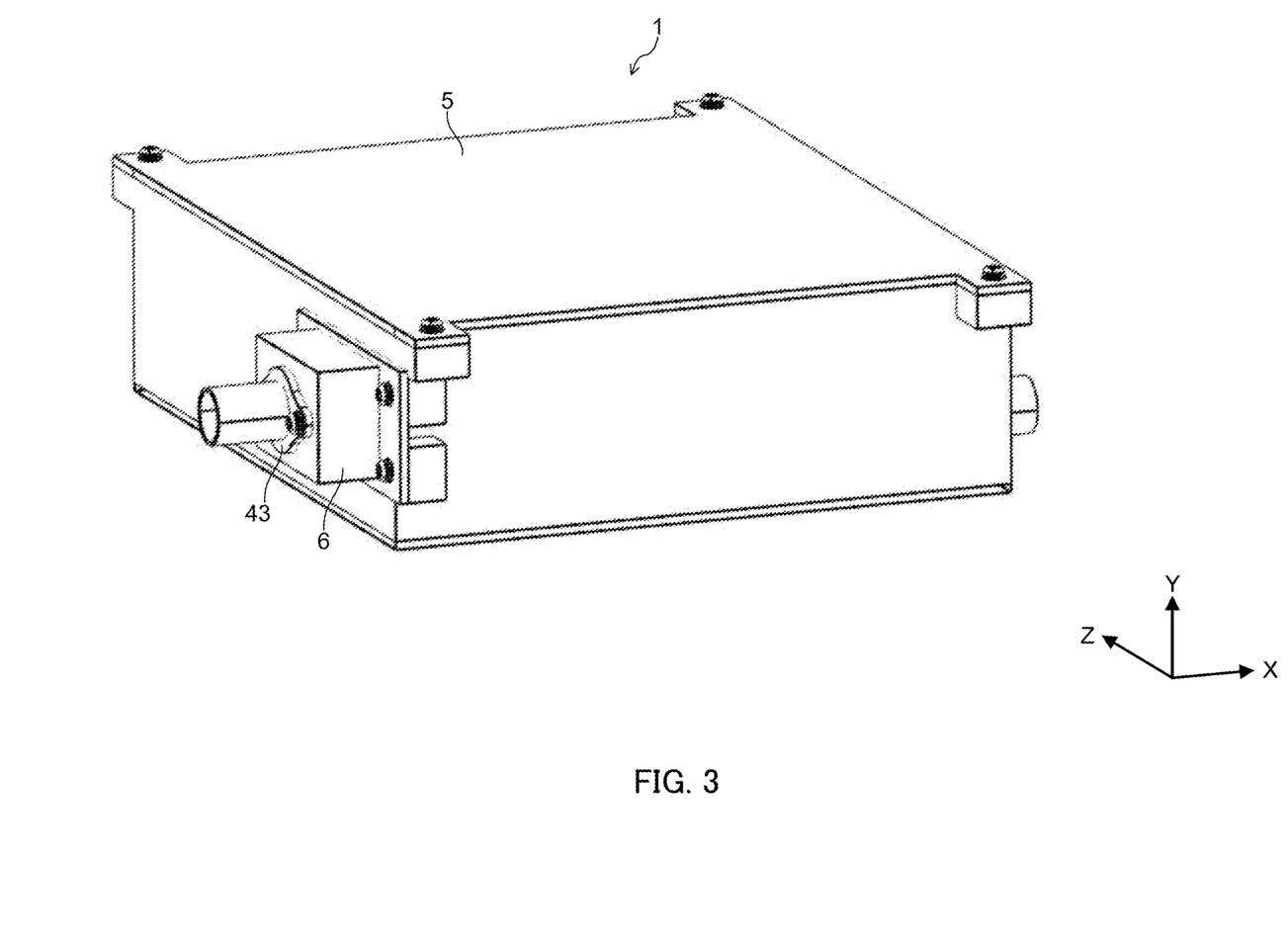
FIG. 3 illustrates an external appearance of a charging apparatus according to the embodiment of the present disclosure.

FIG. 2 is an enlarged view of an ACDC converter. FIG. 3 is an enlarged view of a terminal and a harness. As illustrated in FIG. 2, ACDC converter 10 includes board 50. Terminal 41 is connected to board 50. More specifically, terminal 41 is connected to the secondary winding side of the transformer 30 mounted on board 50. Terminal 41 is a conductive round terminal that is connected to one end of harness 42 by caulking, welding and the like.

Connector 43 is connected to harness 42 on the side opposite to terminal 41 side. Connector 43 is, for example, a connector disposed on the housing side of ACDC converter 10.

Figure 4:
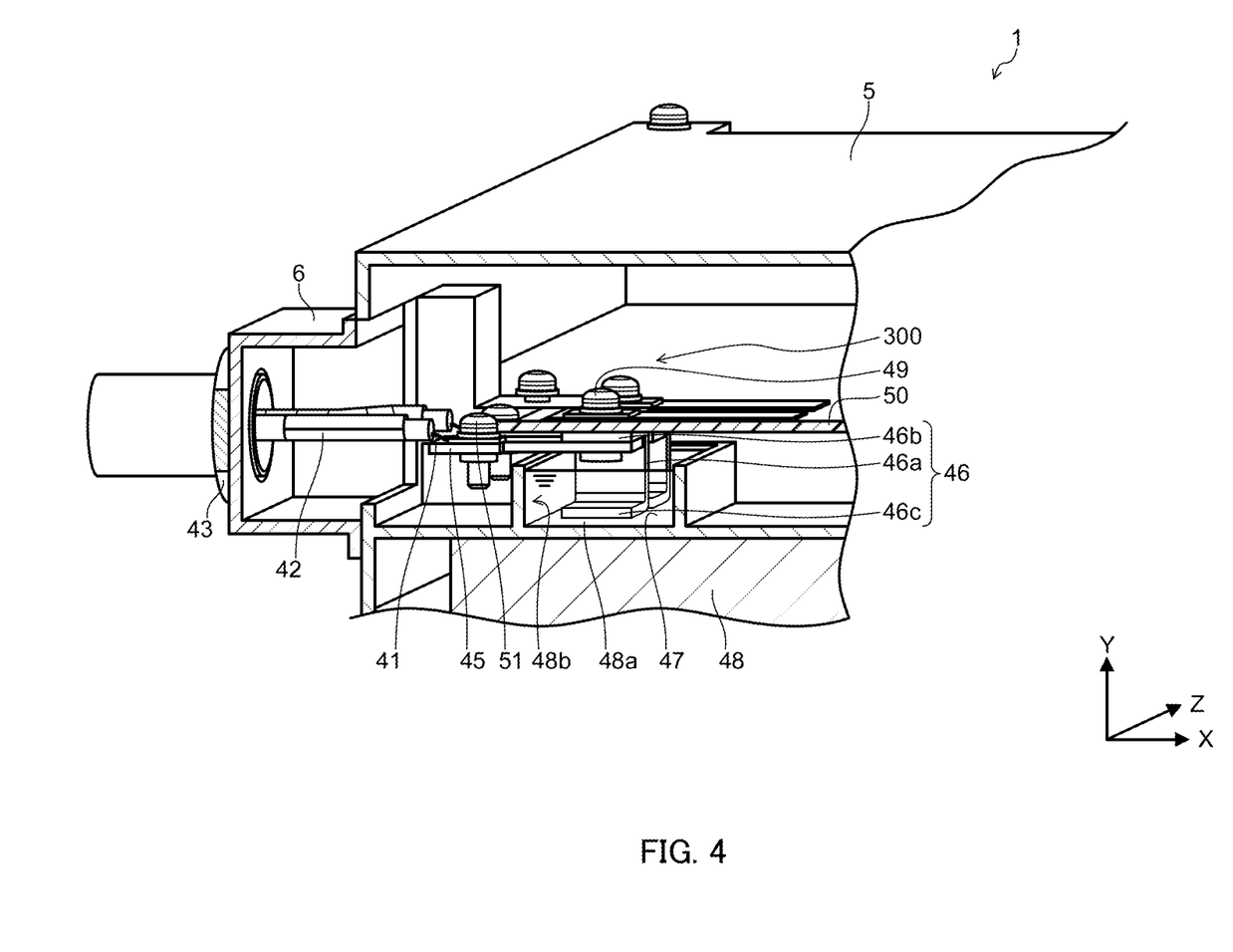
FIG. 4 illustrates an internal structure of a charging apparatus according to the embodiment of the present disclosure.

Next, with reference to FIGS. 3 and 4, the cooling structure is elaborated. In FIG. 3, etc., the X-axis direction, the Y-axis direction, and the Z-axis direction are the direction parallel to the X axis, the direction parallel to the Y axis, and the direction parallel to Z axis, respectively. The X-axis direction and the Y-axis direction are orthogonal to each other. The X-axis direction and the Z-axis direction are orthogonal to each other. The Y-axis direction and the Z-axis direction are orthogonal to each other. The XY plane is a virtual plane parallel to the X-axis direction and the Y-axis direction. The XZ plane is a virtual plane parallel to the X-axis direction and the Z-axis direction. The YZ plane is a virtual plane parallel to the Y-axis direction and the Z-axis direction. In addition, in the X-axis direction, the arrow direction is the plus X-axis direction, and the direction opposite to this direction is the minus X-axis direction. In the Y-axis direction, the arrow direction is the plus Y-axis direction, and the direction opposite to this direction is the minus Y-axis direction. In the Z-axis direction, the arrow direction is the plus Z-axis direction, and the direction opposite to this direction is the minus Z-axis direction.

FIG. 3 illustrates an external appearance of a charging apparatus according to the embodiment of the present disclosure, and FIG. 4 illustrates an internal structure of a charging apparatus according to the embodiment of the present disclosure. Charging apparatus 1 includes housing 5 that houses circuit components that constitute ACDC converter 10, DCDC converter 11 and the like illustrated in FIG. 1 and the like, and vehicle side wiring unit 6 connected to housing 5. As illustrated in FIG. 4, bus bar 45 is provided in vehicle side wiring unit 6.

Cooling structure 300 includes harness 42, board 50 electrically connected to harness 42, and heat transfer member 46 whose one end is connected between harness 42 and board 50. The heat of harness 42 is transmitted to heat transfer member 46. In addition, cooling structure 300 includes heat sink 48 that is a heat dissipation member connected to the other end of heat transfer member 46 and configured to radiate the heat transmitted to heat transfer member 46. Bus bar 45 is a connecting member that electrically connects harness 42 to board 50.

Bus bar 45 has a function of relaying, to harness 42, a current output from circuit components that constitute ACDC converter 10 provided in board 50, a function of relaying heat generated at harness 42 to heat transfer member 46 mechanically and thermally connected to bus bar 45, and the like. Transfer member 46 is elaborated later.

Bus bar 45 is a conductive member having a rod shape. Bus bar 45 is disposed on the end surface side of board 50 in the minus Y-axis direction, for example. The material of bus bar 45 is copper, for example. Note that the material of bus bar 45 is not limited to copper, and may be a conductive material such as gold, silver, aluminum, platinum, and chromium. In addition, the material of bus bar 45 may be a brass or other copper alloy, an aluminum alloy or the like, or it may be surface plated with gold, silver, nickel, or tin to prevent oxidation or reduce contact resistance. In addition, the shape of bus bar 45 is not limited to the rod shape, and may be an L-shaped conductive member composed of a bent portion, a first extending portion extending from the bent portion in the plus Y-axis direction, and a second extending portion extending from the bent portion in the plus X-axis direction, for example.

Terminal 41 is disposed at a position on the end portion side in the minus X-axis direction in bus bar 45, and screw 51 is inserted to a hole of the terminal and a hole (not illustrated in the drawing) formed at a position on the end portion side in the minus X-axis direction in bus bar 45. Thereafter, a nut or the like is fastened to the male screw portion of screw 51, for example. In this manner, the male screw portion of screw 51 is mechanically connected to terminal 41, and terminal 41 is fixed in intimate contact with the end portion of bus bar 45 in the minus X-axis direction. In this manner, terminal 41 is firmly connected to bus bar 45, and therefore the electrical connection between terminal 41 and bus bar 45 is maintained even when, for example, charging apparatus 1 is vibrated due to the travelling of vehicle 100, and thus, highly reliable joining is achieved.

A female screw portion (not illustrated in the drawing) is formed at a position on an end portion side in the plus X-axis direction in bus bar 45. Screw 49 is inserted to the female screw portion of bus bar 45 from the end surface side of bus bar 45 in the plus Y-axis direction toward the end surface side in the minus Y-axis direction. When the male screw portion of screw 49 is screwed to the female screw portion of bus bar 45, the gap between board 50 and the end surface of bus bar 45 in the minus Y-axis direction disposed on the end surface side of board 50 in the minus Y-axis direction. In this manner, the end portion of heat transfer member 46 inserted to the gap is sandwiched between bus bar 45 and board 50. In this manner, heat transfer member 46 is firmly connected to bus bar 45, and the mechanical connection between heat transfer member 46 and bus bar 45 is maintained even when, for example, charging apparatus 1 is vibrated due to the travelling of vehicle 100, and thus highly reliable joining is achieved.

In addition, when heat transfer member 46 is sandwiched, the end surface of heat transfer member 46 in the plus Y direction makes contact with a terminal provided in board 50, for example. This contact means a state where heat transfer member 46 is mechanically connected to a conducting body on board 50. The conducting body on board 50 may be a specialized conductive member for connection of heat transfer member 46, or copper foil (wiring pattern) on board 50, for example. With heat transfer member 46 in contact with board 50, bus bar 45 is electrically connected to circuit components (such as transformer 30 illustrated in FIG. 1) on board 50 through heat transfer member 46.

In addition, when heat transfer member 46 is sandwiched, heat transfer member 46 is thermally connected to the end portion of bus bar 45 in the plus X-axis direction. Thus, the heat transmitted from harness 42 to bus bar 45 is transmitted to heat transfer member 46 before it is transmitted to board 50. The most part of the heat transmitted to heat transfer member 46 is transmitted to heat sink 48 thermally connected to heat transfer member 46, and then radiated from the surface of heat sink 48.

Next, a configuration of heat transfer member 46 is described. Heat transfer member 46 is a conductive member having a C-shape in the YZ-cross-section, for example. The material of heat transfer member 46 is the same as that of bus bar 45, for example. Heat transfer member 46 includes a bottom portion 46a as a conductive member parallel to the XY plane, upright portion 46b that rises in the minus Z-axis direction from an end portion of bottom portion 46a in the plus Y-axis direction, and upright portion 46c that rises in the minus Z-axis direction from an end portion of bottom portion 46a in the minus Y-axis direction, for example.

Upright portion 46b is formed in a plate-shape parallel to bus bar 45. More specifically, upright portion 46b is formed in a plate-shape parallel to an end portion region of bus bar 45 in the plus X-axis direction to ensure a large contact area with bus bar 45 when upright portion 46b is sandwiched between bus bar 45 and board 50. When sandwiched between bus bar 45 and board 50, upright portion 46b is electrically and thermally connected to bus bar 45, and electrically connected to board 50 because upright portion 46b is a conductive member. Accordingly, even when upright portion 46b is interposed between bus bar 45 and board 50, current flows from bus bar 45 to board 50, and the heat of bus bar 45 is transmitted to upright portion 46b.

A through hole (not illustrated in the drawing) for insertion of screw 49 is formed in upright portion 46b. The through hole is disposed coaxially with the above-described the female screw portion of bus bar 45.

Upright portion 46c is a portion that makes surface-contact with heat sink 48, and is formed in a plate-shape parallel to end surface 48a of heat sink 48 in the plus Y-axis direction to ensure a large thermal contact area with heat sink 48, for example. End surface 48a of heat sink 48 is a part of a wall surface that defines groove 48b of heat sink 48. Groove 48b is, for example, a space recessed in the minus Y-axis direction and is formed on a surface of heat sink 48 that faces board 50. Groove 48b extends in the Z-axis direction. An end surface of upright portion 46c in the minus Y-axis direction is thermally connected to heat sink 48 with potting 47 therebetween, for example. Potting 47 is made of a silicon material, and has a function of bringing upright portion 46c into intimate contact with heat sink 48 in the state where upright portion 46c is electrically isolated from heat sink 48, for example. In this manner, the heat dissipation can be improved by reducing the gap between upright portion 46c and heat sink 48 to increase the contact area while preventing the current from harness 42 from flowing through heat sink 48. Accordingly, the heat of upright portion 46c can be efficiently transmitted to heat sink 48 without using a fastening member or the like. Note that when heat transfer member 46 is formed in a C-shape, it can function as an antenna. With the configuration in which the wall surface that defines groove 48b of heat sink 48 surrounds the periphery of heat transfer member 46, the influence of noise on heat transfer member 46 can be reduced.

Note that the shape of heat transfer member 46 is not limited to the C-shape as long as it has a structure in which at least one end thereof thermally makes contact with bus bar 45, and may be a shape such as a U-shape, an I-shape, and an L-shape in the YZ-cross-section. It should be noted that, with heat transfer member 46 having the C-shape, heat transfer member 46 can be readily manufactured by pressing a plate-shaped conductive member. Accordingly, in comparison with heat transfer member 46 having an I-shape or the like, the production efficiency of heat transfer member 46 can be increased. Further, since the contact area with heat sink 48 and bus bar 45 can be increased in comparison with heat transfer member 46 having an I-shape, an L-shape or the like, the heat transmitted from harness 42 can be efficiently transmitted to heat sink 48, and thus the temperature rise of board 50 can be suppressed. Note that heat transfer member 46 may have a configuration in which upright portion 46b is made of a material with thermal conductivity while bottom portion 46a and upright portion 46c are made of a material with no thermal conductivity.

Figure 5:
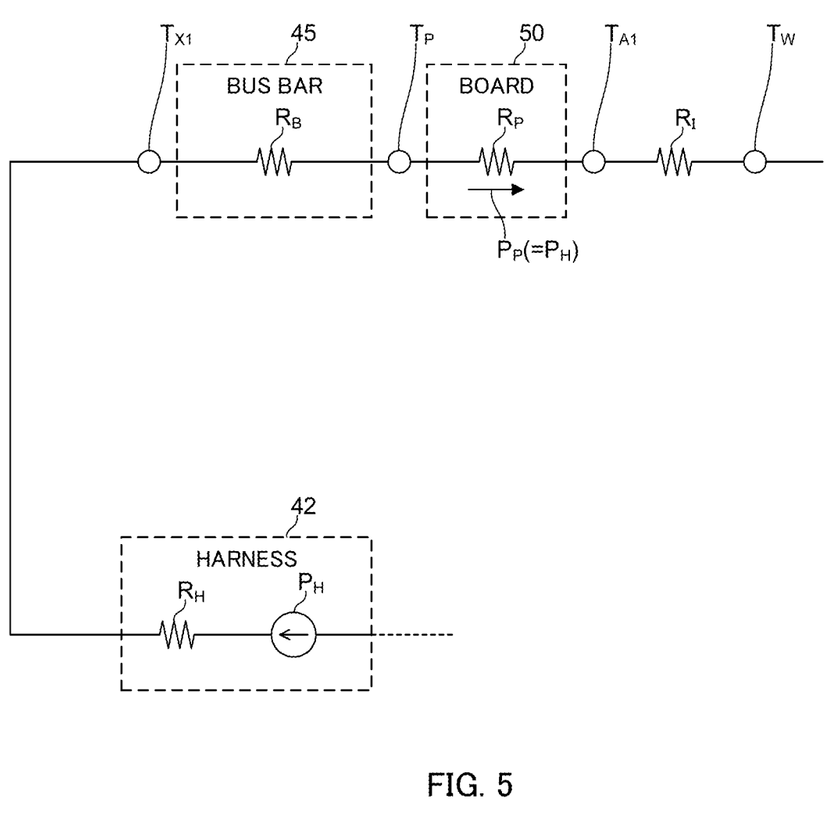
FIG. 5 illustrates a heat resistance model on a heat transmission path in a charging apparatus provided with no heat transfer member.
Figure 6:
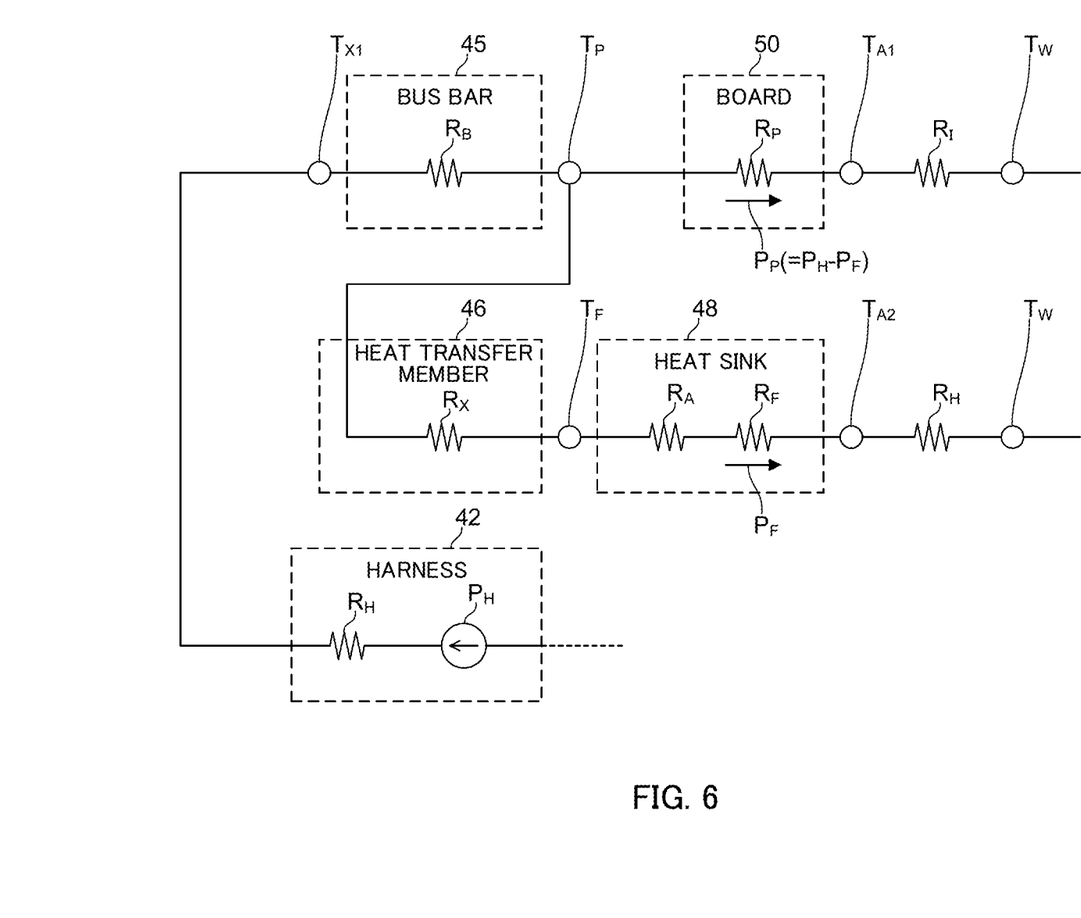
FIG. 6 schematically illustrates a heat resistance model on a path through which the heat of a harness is transmitted in the charging apparatus according to the present embodiment.

Next, with reference to FIGS. 5 and 6, a heat resistance model of cooling structure 300 is described.

FIG. 5 schematically illustrates a heat resistance model on a path through which the heat of a harness is transmitted in a typical charging apparatus with no heat transfer member. $P_H$ represents a heat corresponding to power loss at harness 42. $R_H$ represents the heat resistance [K/W] of harness 42. $R_H$ includes the heat resistance of the conducting body of harness 42 and the heat resistance of terminal 41 connected to harness 42. Note that in the case where harness 42 is directly connected to bus bar 45 without using terminal 41, $R_H$ includes the heat resistance of the conducting body of harness 42.

$T_{x1}$ represents the temperature of a connection part of harness 42 and bus bar 45. RB represents the heat resistance of bus bar 45. More specifically, RB represents the heat resistance from the connection part of bus bar 45 with harness 42 to the connection part of bus bar 45 with the conducting body (such as a wiring pattern and a terminal) on board 50.

$T_p$ represents the temperature of the connection part of bus bar 45 and board 50. $R_P$ represents the heat resistance of board 50, and $R_P$ includes the heat resistance of the wiring pattern, the terminal and the like on board 50 and the like, for example. $T_{A1}$ represents the temperature of the connecting part of the heat sink and board 50. $R_I$ represents the combined heat resistance of the heat resistance due to heat conduction of the heat sink itself connected to board 50 and the heat resistance due to heat transmission between the heat sink and the cooling medium. $T_W$ represents the temperature of heat dissipation refrigerant such as coolant and air.

$P_p$ represents the heat transmitted to board 50. When it is assumed that all the heat transmitted from harness 42 to bus bar 45 is transmitted to board 50, $P_p$ and $P_H$ are substantially equal to each other. Accordingly, when the heat generated at harness 42 due to a large current flowing through harness 42 is transmitted to board 50, the temperature of board 50 may exceed the rated temperature of board 50 and board 50 may be damaged even when the temperature of harness 42 is equal to or smaller than the rated temperature of harness 42.

FIG. 6 schematically illustrates a heat resistance model on a path through which the heat of the harness is transmitted in the charging apparatus according to the present embodiment. Below, description for the same reference numerals as the reference numerals illustrated in FIG. 5 is omitted, and different reference numerals are described.

$R_x$ represents the heat resistance of heat transfer member 46. $T_F$ represents the temperature of the connecting part of heat transfer member 46 and heat sink 48. $R_H$ is the heat resistance of the heat transmittance between the heat dissipation refrigerant and the heat sink, which depends on the physical property and flow velocity of the heat dissipation refrigerant, and the shape of the heat sink. $T_{A2}$ represents the temperature of the heat sink surface. $P_F$ depends on the ratio of the sum $(R_x+R_A+R_F+R_H)$ of $R_x$, $R_A$, $R_F$, and $R_H$ with respect to the sum $(R_p+R_I)$ of $R_p$ and $R_I$.

$R_F$ represents the heat resistance of an insulator (such as potting 47) provided between heat transfer member 46 and heat sink 48. In the heat dissipation path composed of heat transfer member 46, heat sink 48 and $R_H$, $R_A$ is predominant. To reduce $R_F$, for example, it is effective to increase the opposing area of heat transfer member 46 and heat sink 48 and to reduce the distance from upright portion 46c to potting 47. $R_A$ represents the heat resistance of heat sink 48. When it is assumed that all the heat transmitted from harness 42 to heat transfer member 46 is transmitted to heat sink 48, $P_p$ is calculated from $Pp=P_H-P_F$, and accordingly the value of $P_p$ illustrated in FIG. 6 is smaller than the value of $P_p$ illustrated in FIG. 5.

In cooling structure 300 according to the present embodiment, since a parallel circuit of heat resistance is formed, the heat generated at harness 42 is less transmitted to board 50 even in the case where the combined heat resistance $(R_x+R_A+R_F+R_H)$ through heat transfer member 46 is higher than the combined heat resistance $(R_p+R_I)$ through board 50, for example. It should be noted that, it is preferable that the heat resistance of heat transfer member 46 be lower than the heat resistance of the conducting body of board 50, because the heat generated at harness 42 is readily transmitted to heat transfer member 46 and the temperature rise of board 50 can be further suppressed.

Note that heat transfer member 46 is not limited to a conductive member, and may be composed of a non-conductive member such that the heat resistance of heat transfer member 46 is lower than the heat resistance of the conducting body of board 50, for example. Examples of the non-conductive member with low heat resistance (high thermal conductivity) include alumina, silicon, and germanium. In this case, to ensure electrical connection between bus bar and board 50, it is preferable to additionally provide a conductive member extending from bus bar 45 to board 50 as well as screw 49. With such a configuration, the ease of assembly is improved since non-conductive heat transfer member 46 can be directly fixed to heat sink 48 without using potting 47 and tasks in assembly of charging apparatus 1 such as positioning of non-conductive heat transfer member 46 can be eliminated.

Next, an assembling method of charging apparatus 1 is described. When vehicle side wiring unit 6 illustrated in FIG. 4 is installed to housing 5, vehicle side wiring unit 6 is moved in the plus X-axis direction to a position where an end of bus bar 45 in the plus X-axis direction is opposite to an end surface of heat transfer member 46 in the minus Y-axis direction. Then, at the position where the end of bus bar 45 is opposite to the end surface of heat transfer member 46 in the minus Y-axis direction, screw 49 illustrated in FIG. 4 is screwed to bus bar 45. In this manner, bus bar 45 is thermally connected to heat transfer member 46, and bus bar 45 is further electrically connected to board 50. By installing vehicle side wiring unit 6 to housing 5, the length of the conductive member (such as harness 42 and bus bar 45) where a large current flows can be reduced, and the loss of the conductive member can be reduced, and further, the use amount of the conductive member can be reduced. Accordingly, weight reduction of vehicle 100 can be achieved while improving the charging efficiency of charging apparatus 1, for example. Note that one end of bus bar 45 may be fixed to vehicle side wiring unit 6.

In addition, in charging apparatus 1 according to the present embodiment, since the heat of harness 42 is less transmitted to board 50, the lifetime of the circuit components such as an electrolyte capacitor and a semiconductor switching device mounted on board 50 can be increased, and degradation of the quality of the circuit components are suppressed, and thus, the reliability of charging apparatus 1 is improved. In addition, in the case where a cooling fan for cooling circuit components and the like of board 50 is used, the operation time of the cooling fan can be reduced, and thus the lifetime of the cooling fan can be increased. In addition, since the heat of harness 42 is less transmitted to board 50, it is possible to prevent the junction temperature of the semiconductor device mounted on board 50 from becoming equal to or greater than the rated temperature, and charging apparatus 1 that achieves highly reliable operation can be obtained.

In addition, the position where heat transfer member 46 is connected is not limited as long as it is connected between harness 42 and board 50, and is not limited to the position between bus bar 45 and board 50 (the position where an end of bus bar 45 and board 50 are opposite to each other). For example, the position where heat transfer member 46 is connected may be a position where connected harness 42 is connected to bus bar 45. In this case, for example, when one end of heat transfer member 46 is connected and sandwiched between the terminal of harness 42 and bus bar 45, heat transfer member 46 is thermally connected to harness 42, and bus bar 45 is directly connected to board 50. In addition, the position where heat transfer member 46 is connected may be an intermediate portion of harness 42. In this case, by welding and screw-fixing (screw fastening) one end of heat transfer member 46 to bus bar 45, heat transfer member 46 is thermally connected to bus bar 45.

Note that cooling structure 300 according to the present embodiment is also applicable to apparatuses other than ACDC converter 10, such as DCDC converter 11 and inverter 4. It should be noted that, since the heat of harness 42 generated by a large current during charging is less transmitted to board 50 through application of cooling structure 300 to ACDC converter used to charge in-vehicle battery 2 that requires boost charging, it is preferable to use cooling structure 300 for ACDC converter 10.

Note that vehicle 100 according to the present embodiment is not limited to automobiles, and may be applied to railroad vehicles, vehicles other than automobiles, such as bikes.

The heat transfer member according to the present disclosure includes a bottom portion, a first upright portion that vertically rises from one end of the bottom portion direction, and a second upright portion that vertically rises from another end of the bottom portion in a direction parallel to the first upright portion.

The first upright portion of the present disclosure is sandwiched between the connecting member and the board.

The first upright portion of the present disclosure is thermally connected to a conducting body on the board and the connecting member.

The first upright portion of the present disclosure is formed in a plate-shape parallel to a surface of the connecting member.

The second upright portion of the present disclosure is formed in a plate-shape parallel to a surface of the heat dissipation member.

The second upright portion of the present disclosure is in surface contact with a surface of the heat dissipation member.

The cooling structure of the present disclosure further includes a potting material configured to bring the second upright portion into intimate contact with the heat dissipation member.

The heat transfer member of the present disclosure has an I-shape.

The heat transfer member of the present disclosure has an L-shape.

The cooling structure according to the present disclosure further includes a first path configured to transmit heat generated at the harness to the connecting member, the heat transfer member, and the board; and a path configured to transmit the heat generated at the harness to the connecting member, the heat transfer member, and the heat dissipation member.

Although the various embodiments have been described above with reference to the drawings, it goes without saying that the present disclosure is not limited to such examples. It is obvious that a person skilled in the art can conceive of various examples of changes or modifications within the scope of the claims, which are naturally understood to belong to the technical scope of the present disclosure. In addition, each of the components in the above embodiments may be combined as desired without departing from the purpose of the disclosure.

While various embodiments have been described herein above, it is to be appreciated that various changes in form and detail may be made without departing from the sprit and scope of the invention (s) presently or hereafter claimed.

This application is entitled to and claims the benefit of Japanese Patent Application No. 2020-047729, filed on Mar. 18, 2020, the disclosure of which including the specification, drawings and abstract is incorporated herein by reference in its entirety.

The specific examples of the present disclosure have been described in detail above, but they are only examples and do not limit the scope of the claims. The technology described in the scope of the claims includes various variations and modifications of the specific examples illustrated above.

INDUSTRIAL APPLICABILITY

The embodiment of the present disclosure is suitable for a cooling structure, a charging apparatus, and a vehicle.

The invention claimed is:

1. A cooling structure comprising:
a harness;
a board electrically connected to the harness;
a heat transfer member whose one end is connected between the harness and the board, the heat transfer member being a member to which heat of the harness is transmitted; and
a heat dissipation member connected to another end of the heat transfer member and configured to radiate heat transmitted to the heat transfer member;
a connecting member configured to electrically connect the harness to the board, and
wherein one end of the heat transfer member is connected to the connecting member,
wherein another end of the heat transfer member is connected to the heat dissipation member,
wherein a part of the heat transfer member is disposed between a part of the connecting member and a part of the board, and
wherein the part of the connecting member, the part of the heat transfer member and the part of the board are fixed by screw fastening.

2. The cooling structure according to claim 1, wherein a heat resistance of the heat transfer member is lower than a heat resistance of the board.

3. The cooling structure according to claim 1, wherein the heat transfer member has a C-shape.

4. The cooling structure according to claim 3, wherein the heat transfer member includes a bottom portion, a first upright portion that vertically rises from one end of the bottom portion, and a second upright portion that vertically rises from another end of the bottom portion in a direction parallel to the first upright portion.

5. The cooling structure according to claim 4, wherein the first upright portion is sandwiched between the connecting member and the board.

6. The cooling structure according to claim 4, wherein the first upright portion is thermally connected to a conducting body on the board and the connecting member.

7. The cooling structure according to claim 4, wherein the first upright portion is formed in a plate-shape parallel to a surface of the connecting member.

8. The cooling structure according to claim 4, wherein the second upright portion is formed in a plate-shape parallel to a surface of the heat dissipation member.

9. The cooling structure according to claim 4, wherein the second upright portion is in surface contact with a surface of the heat dissipation member.

10. The cooling structure according to claim 4, further comprising a potting material configured to bring the second upright portion into intimate contact with the heat dissipation member.

11. The cooling structure according to claim 1, wherein the heat transfer member has an I-shape.

12. The cooling structure according to claim 1, wherein the heat transfer member has an L-shape.

13. The cooling structure according to claim 1, further comprising:
a first path configured to transmit heat generated at the harness to the connecting member, the heat transfer member, and the board; and
a path configured to transmit the heat generated at the harness to the connecting member, the heat transfer member, and the heat dissipation member.

14. The cooling structure according to claim 1, wherein the heat dissipation member radiates heat transmitted to the heat dissipation member from the heat transfer member through a potting material.

15. The cooling structure according to claim 1, wherein the heat transfer member is made of a conductive material.

16. A charging apparatus comprising the cooling structure according to claim 1.

17. A vehicle comprising the charging apparatus according to claim 16.

* * * * *